US008669812B2

(12) United States Patent
Actis et al.

(10) Patent No.: US 8,669,812 B2
(45) Date of Patent: *Mar. 11, 2014

(54) HIGH POWER AMPLIFIER

(75) Inventors: Robert Actis, Burlington, MA (US); Robert J. Lender, Jr., Pepperell, MA (US); Steve M. Rajkowski, East Kingston, NH (US); Kanin Chu, Nashua, NH (US); Blair E. Coburn, Milford, NH (US)

(73) Assignee: Schilmass Co., L.L.C., Wilmington, DE (US)

(*) Notice: Subject to any disclaimer, the term of this patent is extended or adjusted under 35 U.S.C. 154(b) by 21 days.

This patent is subject to a terminal disclaimer.

(21) Appl. No.: 13/016,599

(22) Filed: Jan. 28, 2011

(65) Prior Publication Data

US 2012/0268213 A1    Oct. 25, 2012

Related U.S. Application Data

(63) Continuation-in-part of application No. 11/629,025, filed as application No. PCT/US2005/039407 on Nov. 1, 2005, now Pat. No. 7,924,097.

(60) Provisional application No. 60/630,343, filed on Nov. 23, 2004, provisional application No. 61/299,072, filed on Jan. 28, 2010.

(51) Int. Cl.
*H03F 3/60* (2006.01)

(52) U.S. Cl.
USPC ............................. 330/286; 330/54

(58) Field of Classification Search
USPC ............................. 330/286, 53, 54
See application file for complete search history.

(56) References Cited

U.S. PATENT DOCUMENTS

| 4,486,719 A |   | 12/1984 | Ayasli |
|---|---|---|---|
| 4,540,954 A | * | 9/1985 | Apel ............................. 330/286 |
| 4,543,535 A |   | 9/1985 | Avasli |
| 4,733,195 A |   | 3/1988 | Tserng et al. |
| 4,754,234 A |   | 6/1988 | Gamand |
| 4,788,511 A |   | 11/1988 | Schindler |
| 5,021,743 A | * | 6/1991 | Chu et al. ........................ 330/54 |
| 5,028,879 A |   | 7/1991 | Kim |

(Continued)

OTHER PUBLICATIONS

International Search Report, dated Aug. 10, 2006, received in International Patent Application No. PCT/US05/39407, 4 pgs.

(Continued)

*Primary Examiner* — Henry Choe
(74) *Attorney, Agent, or Firm* — McAndrews, Held & Malloy, Ltd.

(57) ABSTRACT

A high power amplifier architecture is disclosure. One example configuration includes a first plurality of distributed amplification stages operatively coupled in a first string. A conductive trace associated with the first string provides a stepped structure, such that the associated inductance successively decreases from input to output of the first string. A second plurality of distributed amplification stages is operatively coupled in a second string, and a conductive trace associated therewith provides a stepped structure, such that the associated inductance successively decreases from input to output of the second string. In one example case, each of the first and second strings comprises gallium nitride transistor amplification stages formed on silicon carbide. The module may further include a heat spreader material that thermally and electrically couples to the amplification stages. The conductive trace associated with one string can be shared with another string.

21 Claims, 11 Drawing Sheets

(56) References Cited

U.S. PATENT DOCUMENTS

| | | | |
|---|---|---|---|
| 5,046,155 A | | 9/1991 | Beyer et al. |
| 5,168,242 A | * | 12/1992 | Willems et al. ............... 330/54 |
| 5,177,381 A | * | 1/1993 | Friesen et al. ............... 327/351 |
| 5,361,038 A | * | 11/1994 | Allen et al. .................. 330/54 |
| 5,414,387 A | * | 5/1995 | Nakahara et al. ............ 330/54 |
| 5,469,108 A | * | 11/1995 | Tserng ........................ 330/286 |
| 5,485,118 A | | 1/1996 | Chick |
| 5,801,591 A | | 9/1998 | Parrott |
| 5,986,518 A | * | 11/1999 | Dougherty ................... 333/117 |
| 6,215,360 B1 | * | 4/2001 | Callaway, Jr. ................ 330/310 |
| 6,252,461 B1 | | 6/2001 | Raab |
| 6,538,509 B2 | | 3/2003 | Ren |
| 6,552,634 B1 | | 4/2003 | Raab |
| 6,674,329 B1 | | 1/2004 | Stengel et al. |
| 6,791,417 B2 | | 9/2004 | Pengelly et al. |
| 6,798,281 B2 | * | 9/2004 | Dueme et al. ................ 330/51 |
| 6,900,695 B2 | * | 5/2005 | Ouacha ....................... 330/295 |
| 7,688,135 B2 | * | 3/2010 | Kim et al. .................... 330/124 R |
| 8,058,930 B1 | * | 11/2011 | Kobayashi ................... 330/286 |
| 2003/0231061 A1 | | 12/2003 | Lautzenhiser et al. |
| 2008/0090539 A1 | | 4/2008 | Thompson |

OTHER PUBLICATIONS

International Report on Patentability with Written Opinion of the International Searching Authority, received in International Patent Application No. PCT/US05/39407, 7 pgs.

Notice of Allowance dated Dec. 9, 2010 in U.S. Patent Publication No. US 2009-0309659, 6 pages.

Office Action Response filed Nov. 18, 2010 in U.S. Patent Publication No. US 2009-0309659, 8 pages.

Notice of Allowance dated Oct. 26, 2011 in U.S. Appl. No. 13/081,279, 7 pages.

Office Action Response filed Oct. 19, 2011 in U.S. Appl. No. 13/081,279, 4 pages.

* cited by examiner

HIGH POWER AMPLIFIER

RELATED APPLICATIONS

This application claims the benefit of and priority to U.S. Provisional Application No. 61/299,072, filed Jan. 28, 2010, and is a continuation-in-part of U.S. application Ser. No. 11/629,025, filed Dec. 8, 2006, which is a National Stage of International Application No. PCT/US05/39407, filed Nov. 1, 2005, which claims the benefit of and priority to U.S. Provisional Application No. 60/630,343, filed Nov. 23, 2004. Each of these applications is herein incorporated by reference in its entirety.

STATEMENT OF GOVERNMENT INTEREST

This invention was made with United States Government support. The contract is classified, as is the awarding agency. The contract's public reference number is C-8385. The United States Government has certain rights in this invention.

FIELD OF THE DISCLOSURE

This invention relates to high power amplifiers, and more particularly, to compact high power radio frequency transmitters using wide band gap semiconductor technology, wideband distributed circuit architecture, and thermal packaging approaches.

BACKGROUND

Many existing Electronic Warfare (EW) systems have a requirement for a high Radio Frequency (RF) power transmitter (ranging from tens-of-watts to several hundred watts) having performance over a wide instantaneous frequency bandwidth. Currently, these EW systems are completely reliant on the use of Traveling Wave Tube Amplifier (TWTA) technology to achieve the combination of wide frequency bandwidth and high output power performance. Tube based amplifiers, however, may have two very limiting disadvantages: (1) they are relatively large in physical size and (2) they require very high-voltage power supplies (sometimes thousands of volts). These characteristics may limit the use of TWTAs in transmitter applications that cannot support the large size or high-voltage power supply constraints of the tube-based amplifiers.

Transmitter applications may require some form of High Power Amplifier (HPA) to achieve the RF output power specified for a particular transmitter system. Only two approaches are currently available: (1) tube-based amplifier technology or (2) a solid-state solution. The approaches tradeoff output power level for size and reliability. In tube-based solutions, the high power density capability of the TWTA provides superior output power performance. However, the high-voltage power supply requirement for these amplifiers is not suitable for providing a compact form-factor solution. Present wideband solid-state amplifiers, using established gallium arsenide (GaAs) transistor technology, have significantly lower power density and are primarily limited to low to medium RF power applications (usually less than 15 W). Their power density capability requires a significant level of circuit power-combining, which usually limits the obtainable RF output power level.

The GaAs power solid-state amplifiers do, however, offer a smaller size than tube-based approaches. More recently, Microwave Power Modules (MPM) have offered the combination of a solid-state driver amplifier which then feeds a TWTA as the power stage. This combination has offered a smaller form-factor than the tube alone, but a high voltage power supply is still required. In addition, tube-based amplifiers have been associated with reliability concerns and may not be an option in EW systems that cannot accommodate the size and high-voltage power supply constraints of TWTAs. In general, for wideband, high power requirements, the cumbersome TWTA, along with their high-voltage power supply requirements, do not support transmitter systems requiring small form-factors.

Thus, traditional methods of achieving high power transmitters operating over wide bandwidths utilize large form-factor TWTAs. The use of these tube-based approaches does not permit small form-factor amplifier packages due to the large physical size of the tubes and their associated high-voltage power supplies. Therefore, there is a need for systems that provide small, wideband, high power solid-state transmitters.

SUMMARY

One embodiment of the present invention provides a high power amplifier module. The module includes a first plurality of distributed amplification stages operatively coupled in a first string, wherein a conductive trace associated with the first string is a stepped structure, such that the associated inductance successively decreases from input to output of the first string. The module further includes a second plurality of distributed amplification stages operatively coupled in a second string, wherein a conductive trace associated with the second string is a stepped structure, such that the associated inductance successively decreases from input to output of the second string. In one specific example case, each of the first and second strings comprises gallium nitride transistor amplification stages interconnected by inductors, and wherein the values of said inductors are set such that the voltage and current associated with one of the gallium nitride transistor stages is equal to that associated with the other gallium nitride transistor stages to facilitate maximum power transfer and matching between interconnected stages. In one such specific case, the inductors have values that are set such that the impedance associated with one of the gallium nitride transistor gain stage is not equal to the impedance associated with an adjacent gallium nitride transistor gain stage. In another such specific case, the inductors have values that are set such that the impedance associated with two of the gallium nitride transistor stages is not equal to the impedance associated with an adjacent two gallium nitride transistor stages. In another specific example case, each of the first and second strings comprises gallium nitride transistor amplification stages formed on a silicon carbide substrate. In another specific example case, the amplifier module further includes a heat spreader material that thermally and electrically couples to the gallium nitride transistor stages. In one such case, the heat spreader material is diamond with a metallic coating. The metallic coating can be, for example, gold, in some cases. In another such case, the heat spreader material is chemical vapor deposited diamond with a metallic coating. In one such case, the metallic coating encapsulates the chemical vapor deposited diamond. In another specific example case, the conductive trace associated with the first string is shared with a third string comprising a third plurality of distributed amplification stages. In another specific example case, the high power amplifier module has a solid-state package design to accommodate greater than 8 W/mm$^2$ of power dissipation. In another specific example case, the high power amplifier module has a nominal power gain of greater than 45 dB, a nominal output power of greater than about 50 W, and a frequency bandwidth performance from 1-8 GHz. In one such case, the high power amplifier module has a package dimension equal or less than 1.2 cubic inches. In another specific example case, the high power amplifier module further comprises at least one of a pre-driver and a driver. Numerous variations on this power amplifier architecture will be apparent in light of this disclosure.

For example, another embodiment of the present invention provides a high power amplifier. This example configuration includes a wideband, monolithic microwave integrated circuit comprising modular building blocks including a non-uniform distributed amplifier string comprised of a number of gallium nitride transistor amplification stages interconnected by inductors. The module further includes a heat spreader material that thermally and electrically couples to the gallium nitride transistor stages. In one example such case, the gallium nitride transistor is a dual field plate transistor with a silicon carbide substrate. In another such case, the values of the inductors are set such that the voltage and current associated with one of the gallium nitride transistor stages is equal to that associated with the other gallium nitride transistor stages to facilitate maximum power transfer and matching between interconnected stages. In another such case, the heat spreader material is chemical vapor deposited diamond with a metallic coating.

Another embodiment of the present invention provides a method for forming a power amplifier. The method includes operatively coupling a first plurality of distributed amplification stages in a first string, and providing a conductive trace associated with the first string that is a stepped structure, such that the associated inductance successively decreases from input to output of the first string. The method further includes operatively coupling a second plurality of distributed amplification stages in a second string, and providing a conductive trace associated with the second string that is a stepped structure, such that the associated inductance successively decreases from input to output of the second string. The method further includes providing a heat spreader material that thermally and electrically couples to the gallium nitride transistor stages. In one such case, the conductive trace associated with the first string is shared with a third string comprising a third plurality of distributed amplification stages.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
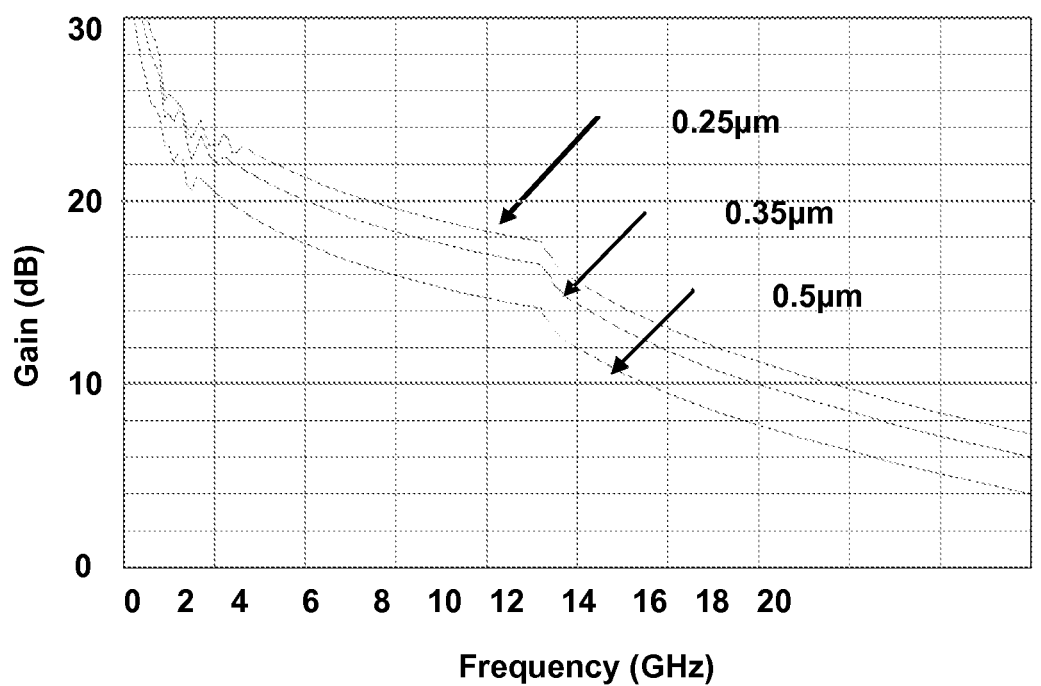
FIG. 1 is a plot of frequency (GHz) versus gain (dB) and shows the Measured Small-signal Gain (MSG/MAG) of 0.25 μm, 0.35 μm, and 0.5 μm gate-length dual field plate GaN, High Electron Mobility Transistor (HEMT) devices using 800 μm of total gate periphery, in accordance with an embodiment of the present invention.

Some embodiments of the present invention may incorporate three elements into a solution for achieving a small form-factor solid-state High Power Amplifier (HPA). Such embodiments may produce smaller sized, high power EW transmitters not currently achievable with tube-based amplifier technology. In one specific example configuration, the first of these elements employs the use of gallium nitride (GaN), a high-power-density semiconductor technology, capable of nearly a 10-fold increase in RF device output power over currently available gallium arsenic (GaAs) semiconductor technology. Dual field plate GaN transistors represent a wideband gap semiconductor technology that is suitable for operation up through 20 GHz and capable of providing a sufficiently high power density to achieve RF power levels comparable to those of TWTAs. GaN transistors operate at significantly lower voltages than TWTAs (e.g., 25 to 40 V), but are capable of achieving power densities that enable GaN transistors, appropriately combined, to provide comparable output power levels to those obtained from TWTAs. Some embodiments of the present invention that employ GaN transistors as TWTA replacements further provide sufficient thermal management in the package design to accommodate a high (e.g., 8-12 W/mm$^2$) power dissipation, and utilize a circuit architecture that can provide a wideband frequency performance and maintain a high-output power level.

One example embodiment of the present invention integrates: (a) advanced GaN device technology, (b) wideband, distributed circuit architecture with Non-Uniformly Distributed Power Amplifier (NDPA), and (c) a thermal packaging approach employing advanced thermal management. The combination of these elements offers a solution for the problem of achieving a small form-factor, solid-state replacement for wideband TWTAs.

In one specific such embodiment, the first element involves the use of a dual field plate GaN device on a silicon carbide (SiC) substrate which provides a transistor technology that operates with sufficiently high power density to achieve output power levels comparable to TWTAs. Currently available GaAs technology can provide RF power densities of only 1-2 W/mm. Achieving output power levels of, for instance, 50 to 100 watts, requires in excess of 25 to 50 mm of total device periphery, a non-realistic size for GaAs Monolithic Microwave Integrated Circuits (MMIC) technology. The use of GaN technology, however, can provide, for instance, greater than 5 W/mm of output power density for realistic die area (e.g., 14-20 mm of device periphery). Hence, high levels of output power can be achieved using realizable die sizes that can offer comparable power levels of tube-based amplifiers.

The second element of this specific example embodiment involves the use of a circuit architecture that is capable of multiple octaves of frequency performance critical for the wideband nature of many EW transmitter systems. By employing NDPA circuit architecture in MMICs that integrate GaN based transistors, the required bandwidth performance typical of TWTAs can be achieved. The use of the NDPA architecture is not only advantageous for its wideband frequency performance, but the distributed nature of the NDPA topology facilitates the thermal management on the GaN die. The individual transistor heat-sources are more distributed than other more conventional MMIC amplifier architectures, and therefore, proximity heating of individual transistors contained on the MMIC is minimized.

The third element of this specific example embodiment includes a thermal management technology that is employed in the amplifier package and allows high-power-density devices to be integrated into miniaturized packages, achieving acceptable electrical performance without the need for liquid or phase-change cooling approaches, in accordance with some such embodiments. A high thermal conductivity heat-spreader material, such as a metallic coated Chemical Vapor Deposited (CVD) diamond material, is placed within the amplifier package beneath the GaN MMICs. The metallic coating may, for example, be gold or other electrically conductive material (e.g., silver, aluminum) or alloys thereof. The metallic coating may be applied to all sides of the packaging (e.g., top, bottom and four sides, assuming a square package, although other package shapes can be used as well) of the CVD diamond material with a thickness of, for example, about 6-12 micrometers in some such embodiments. Other thicknesses may also be used as will be appreciated in light of this disclosure, depending on factors such as the type of coating material (or materials) used and the conductivity of those material(s), and desired power levels. The coating material provides electrical conductivity and facilitates the thermal spreading in the high power dissipation environment of the small form-factor package and significantly reduces the operating junction temperature of the GaN devices, which in turn minimizes any performance degradation that may otherwise be exhibited in GaN devices at high temperature.

The high thermal conductivity heat-spreader material (e.g., 1000 to 1800 W/(m° C.), in some example embodiments) may be incorporated, for instance, into the module flooring to provide improved thermal management for minimizing die junction temperature in the small form-factor amplifier package. Higher output power levels may be obtained from operation of the amplifier with shorter pulse widths. In some such example embodiments, providing such higher output power levels in a form-factor package may be achieved with additional or otherwise supplemental thermal management techniques beyond convection cooling in order to maintain the optimal power levels from the GaN MMICs.

High-power-density GaN transistors embedded or otherwise formed into circuits that operate over broad frequency bandwidths and having these circuits integrated into small packages that are capable of managing a severe thermal environment provide a solid-state replacement for TWTAs. The described three elements provide the desired capability and enables solid-state HPAs that provide comparable performance to TWTAs without the cumbersome size and high-voltage power supply limitations of the tube-based approaches. Example embodiments of the invention have demonstrated a compact (e.g., 1.2 cubic-inches, although numerous other form-factors are possible as will be appreciated in light of this disclosure) TWTA-replacements for use in an EW frequency band.

Several GaN, High Electron Mobility Transistor (HEMTs) were developed to determine the optimal or otherwise suitable dual field plate GaN device technology that can be used to address example amplifier applications in the 1 to 8 GHz frequency band. Using a dedicated mask set incorporating primarily discrete device structures, an initial GaN wafer fabrication run was processed with the specific purpose of evaluating the transistor structures in an effort to select the optimal configuration of device topology, gate-periphery size, and physical device features to select the optimal transistor cell for use in MMICs designed to operate in the desired frequency range. Example devices using three different gate-lengths (0.25 µm, 0.35 µm, and 0.5 µm) were fabricated to evaluate gain-bandwidth performance. The Maximum Stable Gain (MSG) as a function of frequency is shown in FIG. 1 for three 800 µm GaN HEMT discrete devices of varying gate lengths. While the difference in crossover frequency (frequency where the stability factor is above unity) is essentially the same, the gain for the 0.35 µm and the 0.5 µm device is 4 dB and 1 dB lower, respectively than the 0.25 µm device. From a fabrication point of view, the larger the gate length, the more simplified the fabrication tolerances and the higher the process yield.

In addition to device gate-length, the device gate-width and critical channel dimensions were also evaluated using the structures on the discrete device mask set. Example transistor structures were included for the purposes of investigating gate width variation from 100 µm to 500 µm, gate pitch (i.e., gate-to-gate distance) variation from 50 µm to 70 µm, and drain-source spacing variation from 2 µm to 4 µm. The result from these studies was the selection of a more optimized transistor device structure suitable for a baseline GaN device in power amplifier MMIC applications to 10 GHz. From the studies conducted on GaN discrete devices, the selection of a 0.35 µm gate length transistor was chosen for the desired device baseline in MMIC architectures, as this gate-length was a good compromise between maximizing fabrication yield and obtaining adequate gain performance in the amplifier demonstration. A nominal gate pitch of 50 µm and a source-drain channel spacing of 4 µm were selected as the other desired dimensions for the baseline device. As will be appreciated, such example optimal parameters will vary from one application to the next, and the present invention is not intended to be limited to any such example optimal parameters.

Figure 2A:
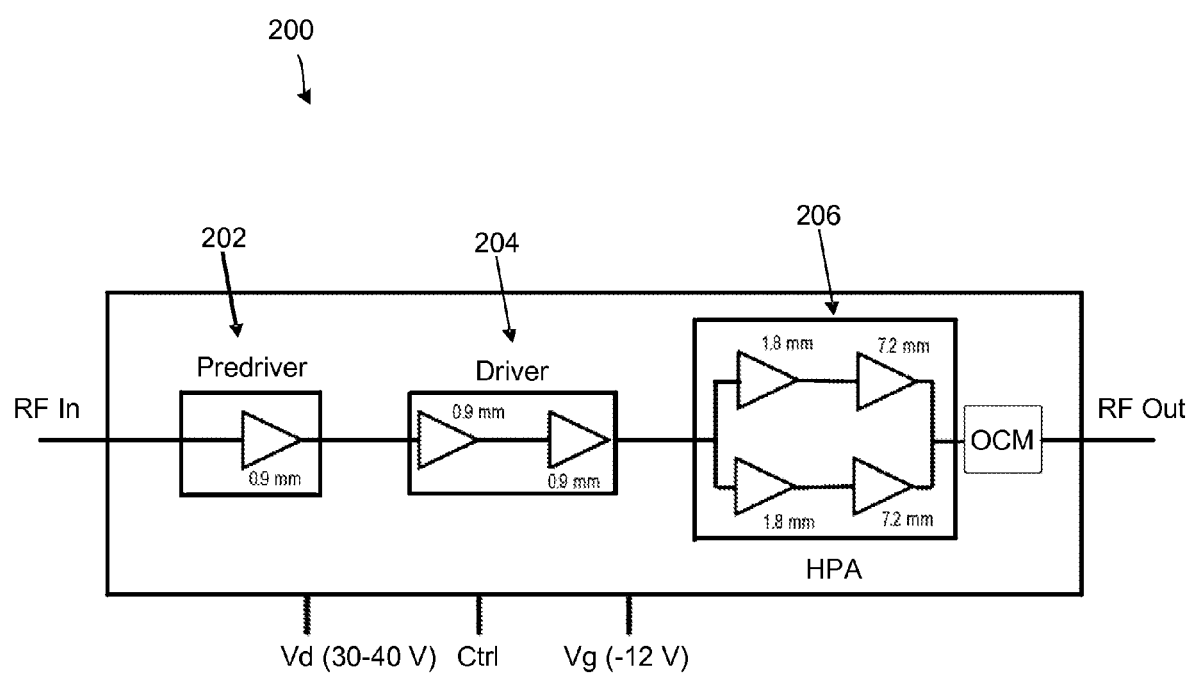
FIG. 2A shows a block diagram of a GaN based high power amplifier module 200 configured in accordance with an embodiment of the present invention.

The HPA can also be designed to satisfy desired application objectives, which in one example case include: (a) a nominal power gain of 45-50 dB, (b) a nominal output power level of 50 W, and (c) a bandwidth performance extending from 1-8 GHz. In order to achieve these example parameters, a MMIC based amplifier architecture was selected. The MMIC approach was selected for achieving the combination of an 8:1 bandwidth response, output power level, and a small overall package size. FIG. 2A illustrates the block diagram of the amplifier architecture 200 used, which is configured in accordance with one embodiment of the present invention. A GaN, MMIC chipset capable of the providing the desired frequency performance, gain, and output power was designed to achieve the overall amplifier performance and size objectives. Using modeling extraction techniques from the discrete devices described earlier, a circuit was designed that provided a series of custom GaN amplifier MMICs to use in the HPA module. As can be seen with reference to FIG. 2A, the resultant chipset included a pre-driver 202, driver 204, and several variants of the HPA 206. The pre-driver 202 and driver 204 MMICs were designed to provide the desired gain and input drive level to the HPA 206, and the HPA 206 was sized appropriately to achieve a nominal 50 W output power, in this example embodiment. The pre-driver 202, driver 204, and the HPA 206 utilize the prior discussed GaN amplifier MMIC design. Embodiments are not limited to the described pre-driver 202, driver 204, and the HPA 206 design as will be appreciated in light of the disclosure. Various additional stage drivers may be included, substituted, or omitted based on the desired output and other design considerations. For instance, in some example embodiment, the HPA 206 may be used without the pre-driver 202 and driver 204.

Figure 2B:
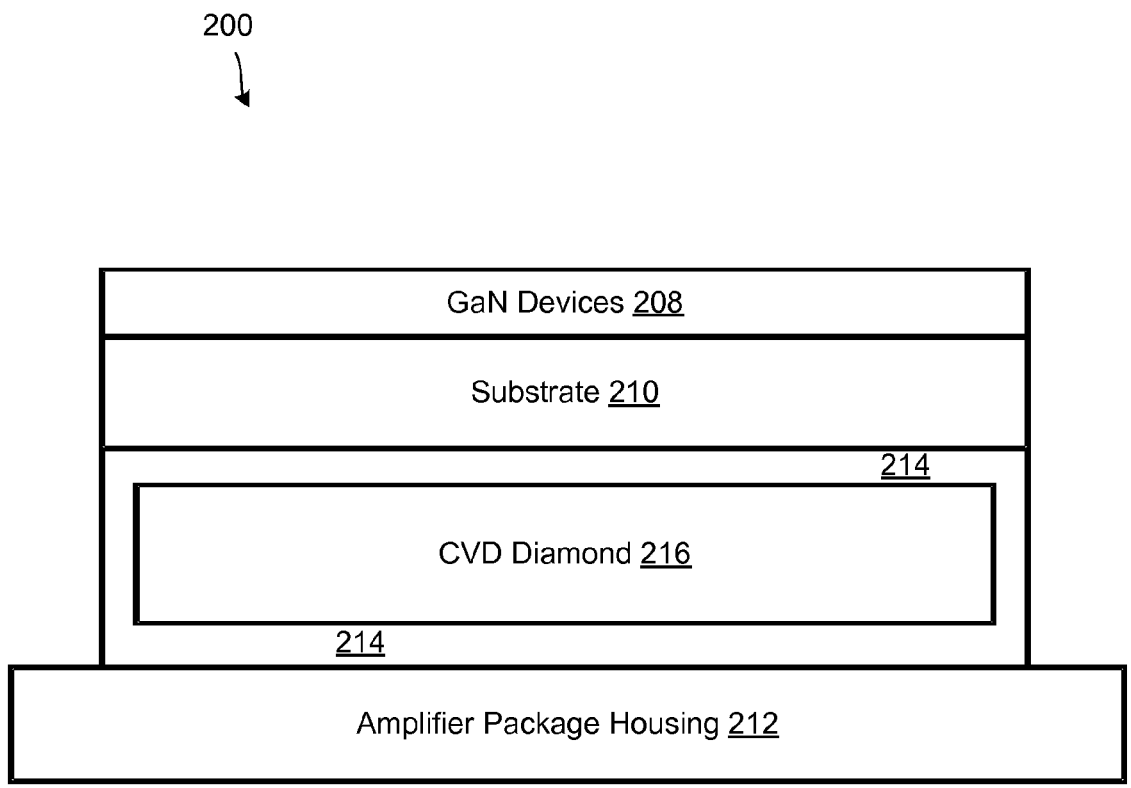
FIG. 2B shows a cross-sectional diagram of a GaN based high power amplifier module 200 configured in accordance with an embodiment of the present invention.

Referring to FIG. 2B, a cross-sectional diagram of the high power amplifier module 200 is shown which is configured in accordance with one embodiment of the present invention. As can be seen, in the example embodiment the amplification stages are implemented with GaN devices 208, which may include the optional pre-driver 202, the optional driver 204, and HPA 206 (or a variant thereof, as will be appreciated in light of this disclosure), and are constructed on top of a substrate 210. The substrate 210 may be constructed using, for example, SiC as previously discussed. Other suitable substrate materials can be used as well. The GaN, MMIC die or chipsets may each be coupled to the amplifier package housing 212 via a metallic coating material 214 of CVD diamond material 216. The construction and thicknesses of the coating material 214 and the CVD diamond material 216 may be, for example, a metal coating of the CVD diamond as described herein. The metallic coating material 214 provides electrical conductivity and facilitates the thermal spreading in the high power dissipation environment of the small form-factor package and significantly reduces the operating junction temperature of the GaN devices 208. In addition, the diamond 216 provides thermal conductivity to dissipate heat from die 208.

Figure 3A:
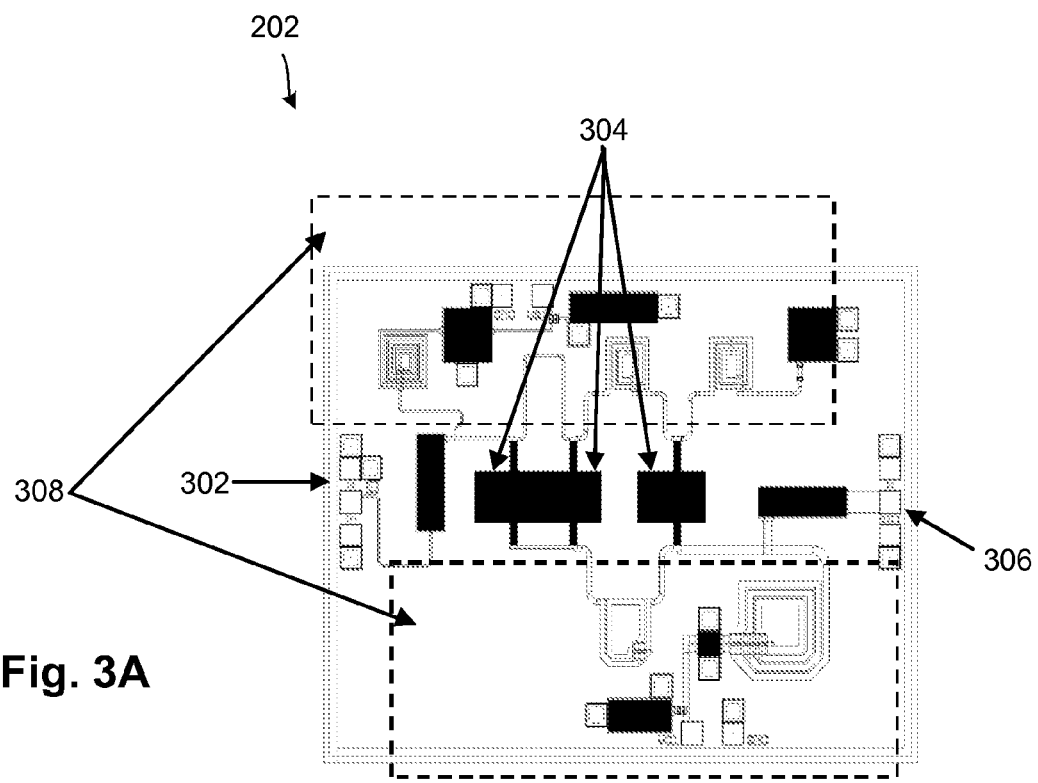
FIGS. 3A-C show a series of layout diagrams of GaN HPA MMICs utilizing an example NDPA circuit architecture, including the pre-driver, driver, and HPA designs, in accordance with an embodiment of the present invention.
Figure 3B:
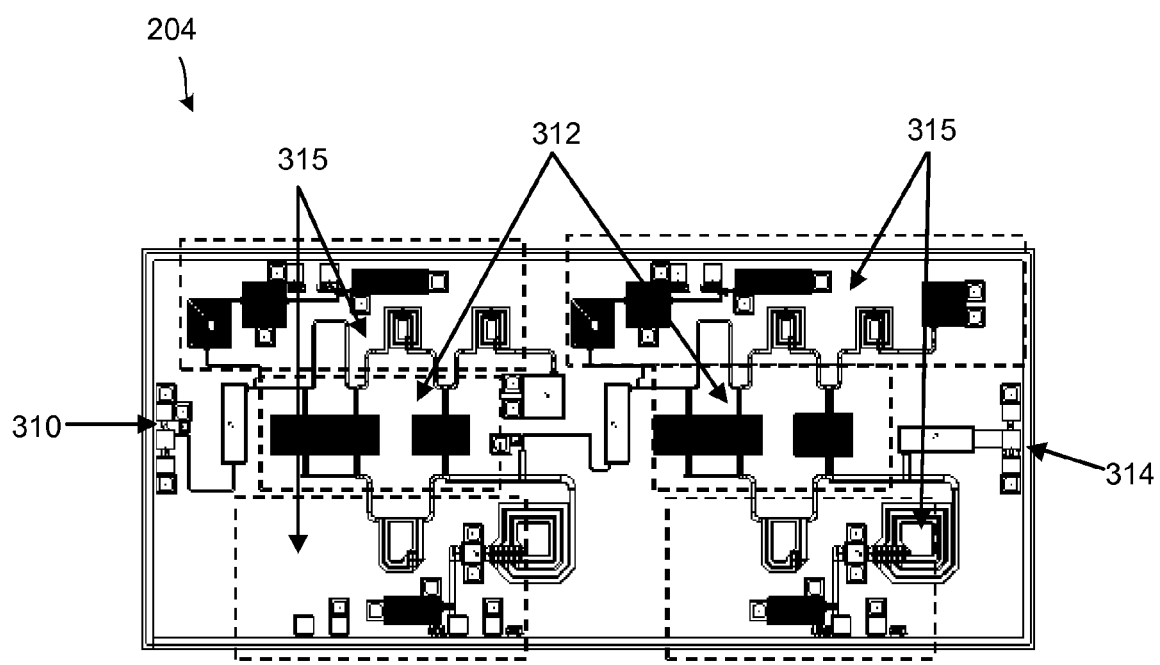
Figure 3C:
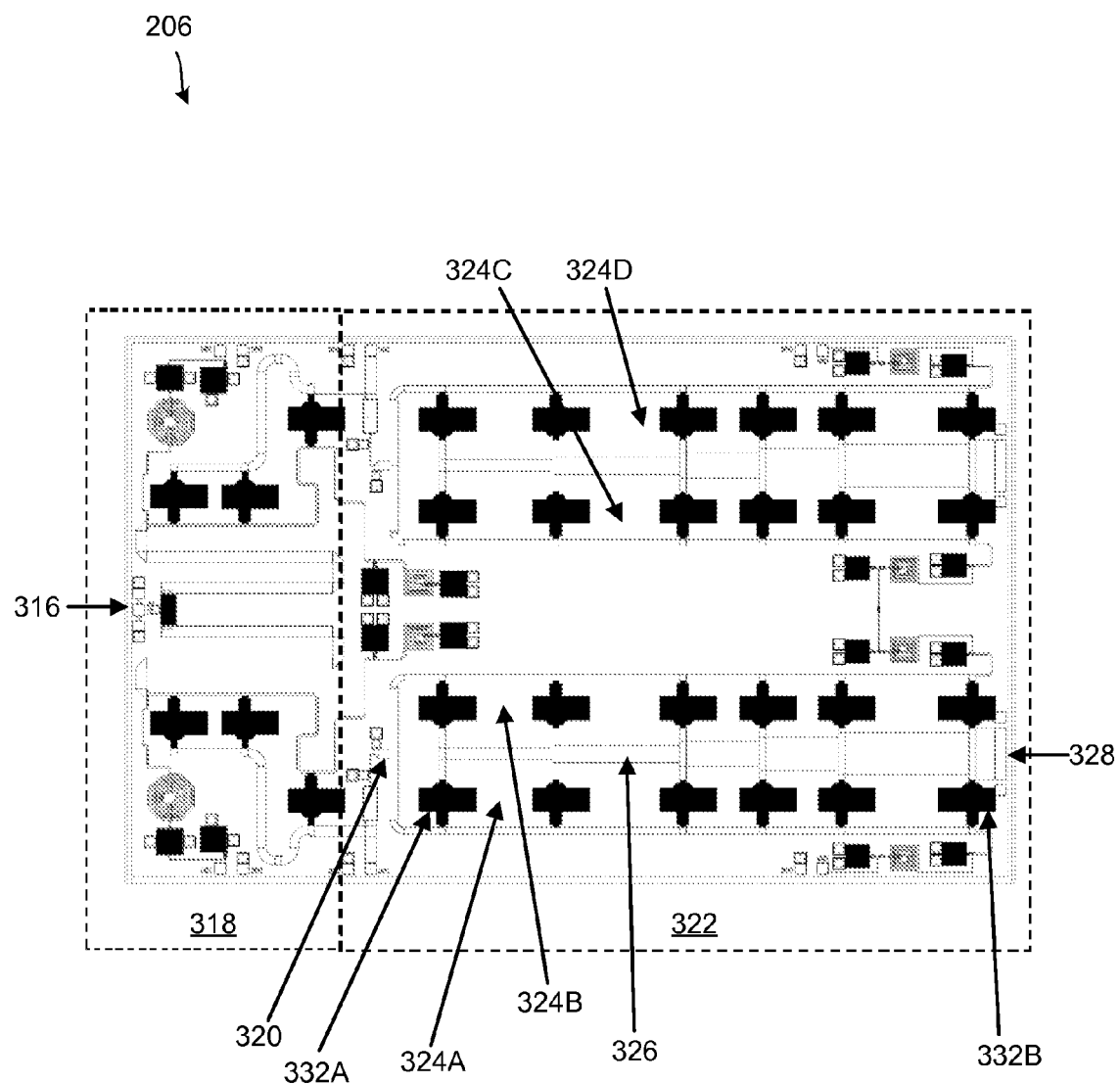

Referring to FIGS. 3A-C, provides example device layout diagrams for the pre-driver 202, driver 204, and the HPA 206, respectively. The cascade of GaN chips including a single-stage pre-driver 202 MMIC in FIG. 3A, a two-stage driver 204 MMIC in FIG. 3B, and a 19.2 mm total-gate-periphery HPA 206 MMIC in FIG. 3C. As can further be seen with reference to FIG. 2A, the single-stage pre-driver MMIC 202 incorporates a single-stage architecture with a 0.9 mm total gate-periphery stage. The pre-driver 202 includes a pre-driver input 302 supplying the amplifying signal to pre-driver GaN transistors 304. The output of the pre-driver GaN transistors 304 is supplied from the pre-driver output 306 forward to the driver input 310. As can further be seen with reference to FIG. 3A, biasing and impedance matching pre-driver circuitry 308 may also be provided on the pre-driver chip. The additional circuitry may include, for example, impedance networks, inductive and capacitive decoupling, and/or other signal conditioning circuitry.

The two-stage driver MMIC 204 incorporates a two-stage architecture with a cascade of two 0.9 mm total gate-periphery stages. The amplifying signal is feed from the driver input 310 to the driver GaN transistors 312 having two stages in series each including three GaN transistors. The output of the driver GaN transistors 312 is supplied from the driver output 314 forward to the HPA driver input 316. Similar to the pre-driver 202, additional biasing and impedance matching driver circuitry 315 may also be provided on the driver chip.

The example detailed embodiment of the HPA 206 shown in FIG. 3C uses NDPA circuit architecture using MMICs. The HPA 206 includes an HPA driver input 316 supplying the amplifying signal to a HPA driver portion 318. The HPA driver portion 318 supplies the amplifying signal to the non-uniform distributed amplifier strings at the power stage 322. In this example case, the power stage 322 includes four strings, here labeled strings 324A, 324B, 324C and 324D. Referring now to strings 324A and 324B, the gate trace forms the divider and impedance transformer between the output of the HPA driver portion 318 and the input 320 to both strings 324A and 324B. As will be appreciated in light of this disclosure, the gate trace can be a stepped structure that steps the impedance on the gate electrodes from the first transistor 332A to the last transistor 332B, such that the associated inductance successively increases from input 320 to output 328. As to the drain electrodes of these devices, the inductances formed by drain trace 326 form inductances between the transistors that successively decrease from input transistor 332A to output transistor 332B. Strings 324A and 324B have their outputs combined and share drain trace 326, which functions to combine the outputs, to inject the drain bias, and to perform an impedance matching function. Strings 324C and 324D have a mirror structure and also function to combine outputs with strings 324A and 324B. Additional details with respect to the use of NDPA circuit architecture in MMICs can be found in the previously incorporated U.S. patent application Ser. No. 11/629,025, entitled, "Solid-State Ultra-Wideband Microwave Power Amplifier Employing Modular Non-Uniform Distributed Amplifier Elements."

Figure 4:
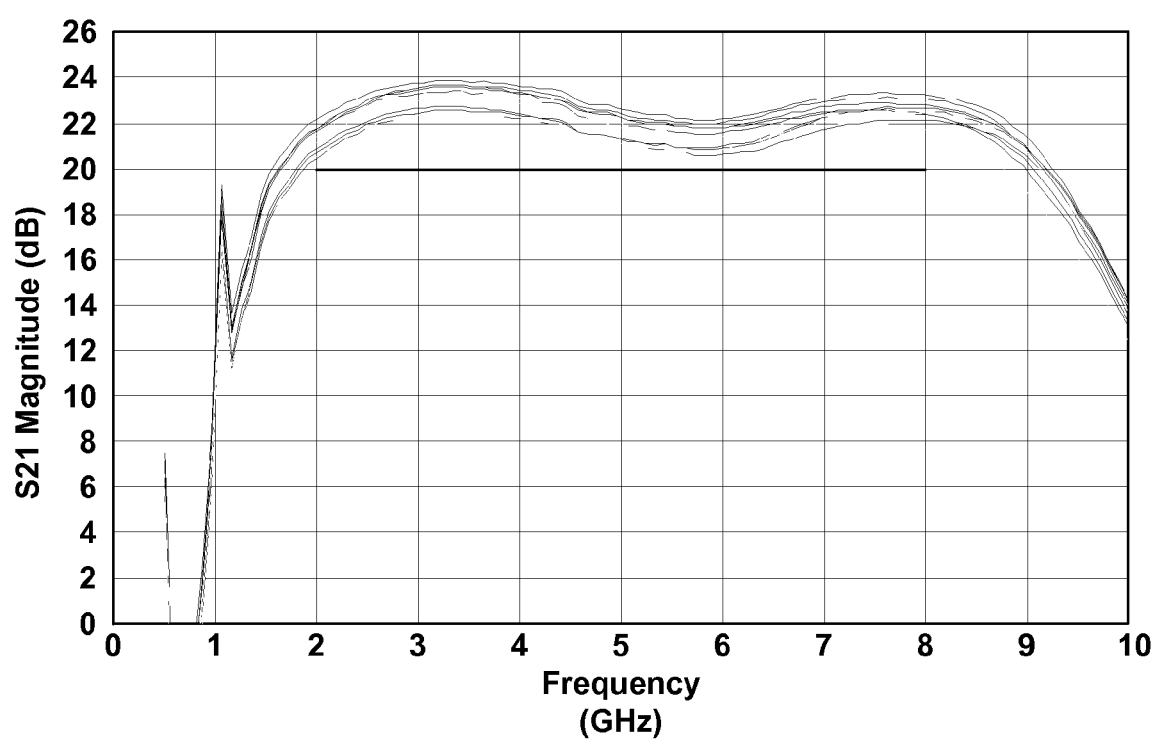
FIG. 4 is a plot of frequency (GHz) versus magnitude (dB) of small-signal performance of twelve GaN driver MMICs shown in FIG. 3B, in accordance with an embodiment of the present invention.

FIG. 4 depicts the small-signal gain performance of the example two-stage driver 204 shown in FIG. 3B. As can be seen, the driver 204 exhibited a nominal 22 dB of small-signal gain over 2 octaves of frequency (2-8 GHz) when measured on-wafer, and 3 octaves of frequency performance when die-attached to a carrier with off-chip bias components. The bandwidth improvement was due to the fact that the lower frequency response of these MMICs is affected by the inductive loading of the DC probes used during the on-wafer measurements. When mounted in a housing package with off-chip bypass capacitors, the MMIC response extends down to 1 GHz, as designed. The single-stage pre-driver 202 MMIC was designed in a similar manner to the driver MMIC 204 using a single 0.9 mm total-gate-periphery GaN circuit. The pre-driver 202 achieved 12 dB of small-signal gain from 1 to 8 GHz.

Figure 5:
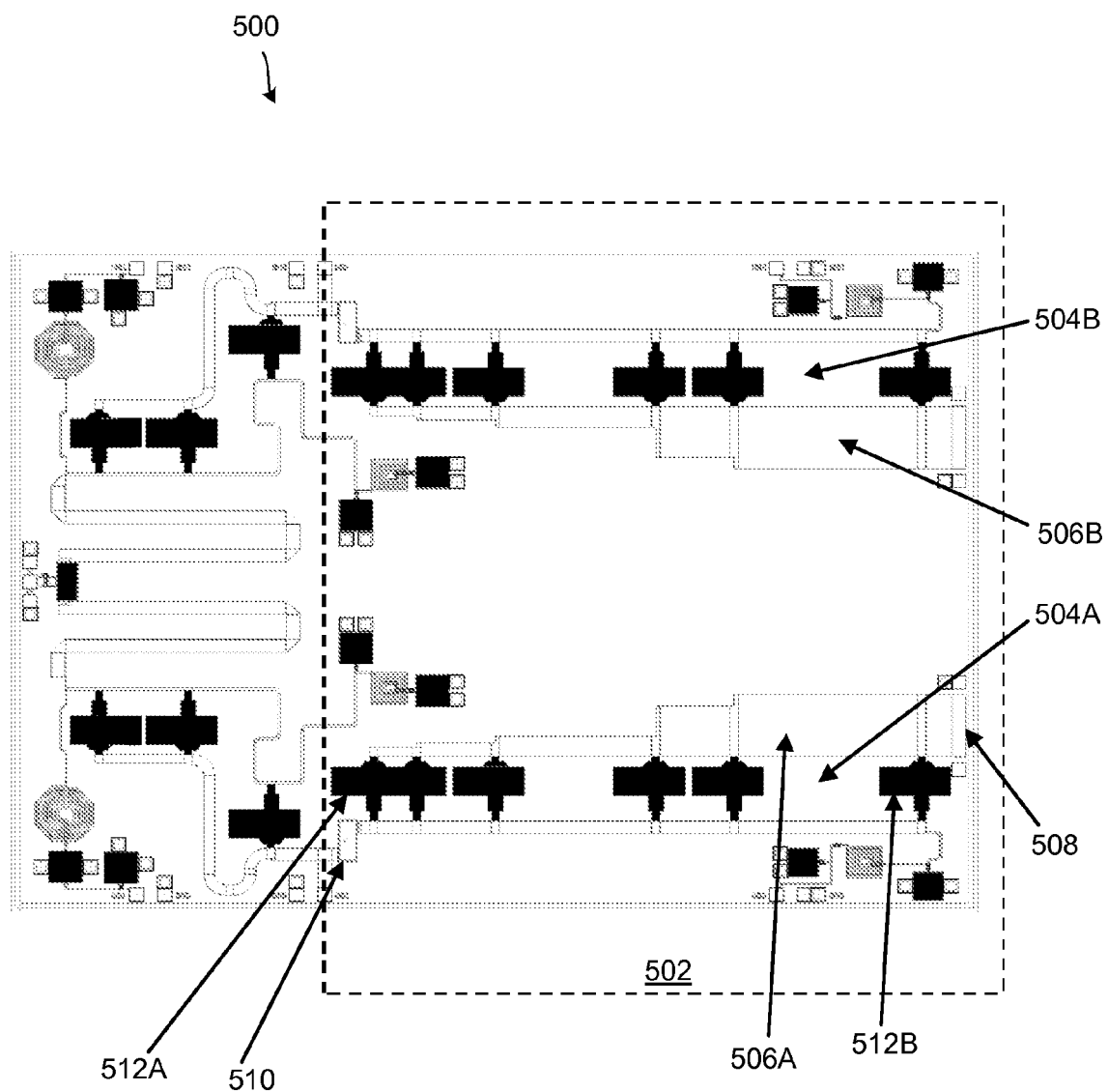
FIG. 5 is a diagram of an example non-shared drain HPA 500, configured in accordance with an embodiment of the present invention.

FIG. 5 illustrates another example of a non-shared drain HPA 500 that can be used in accordance with an embodiment of the present invention. The topology of the non-shared drain HPA 500 is a derivative of a distributed amplifier architecture which, in addition to its inherent wideband frequency performance, also facilities the thermal management of the module by distributing the heat sources of the devices more uniformly throughout the MMIC die area. The non-shared drain HPA 500 may be the same size as example HPA 206 to maintain compatibility in the high power amplifier module assembly, as described herein.

The power stage 502 includes two strings, here labeled strings 504A and 504B. Similar to the previously described HPA 206, the drain trace 506A and 506B are each a stepped structure that steps the impedance on the drain electrodes from the first transistor 512A to the last transistor 512B, such that the associated inductance successively decreases from input 510 to output 508. Strings 504A and 504B have their outputs combined but unlike HPA 206 have individual drain traces 506A and 506B, which functions to combine the cell outputs, to inject the drain bias, and to perform an impedance matching function.

In one specific example case, the non-shared drain HPA 500 may use a 12 mm total-gate-periphery output stage with a 4.8 mm total-gate-periphery first-stage. The 2.5:1 drive ratio was used in this example design to provide sufficient drive power to the second-stage of the non-shared drain HPA 500 and to maintain the desired level of drive compression. The architecture of this chip utilized six 800 um cell devices in the first stage and ten 1.2 mm cell devices in the second stage. The chip size may be 6.831 mm×4.958 mm.

Figure 6:
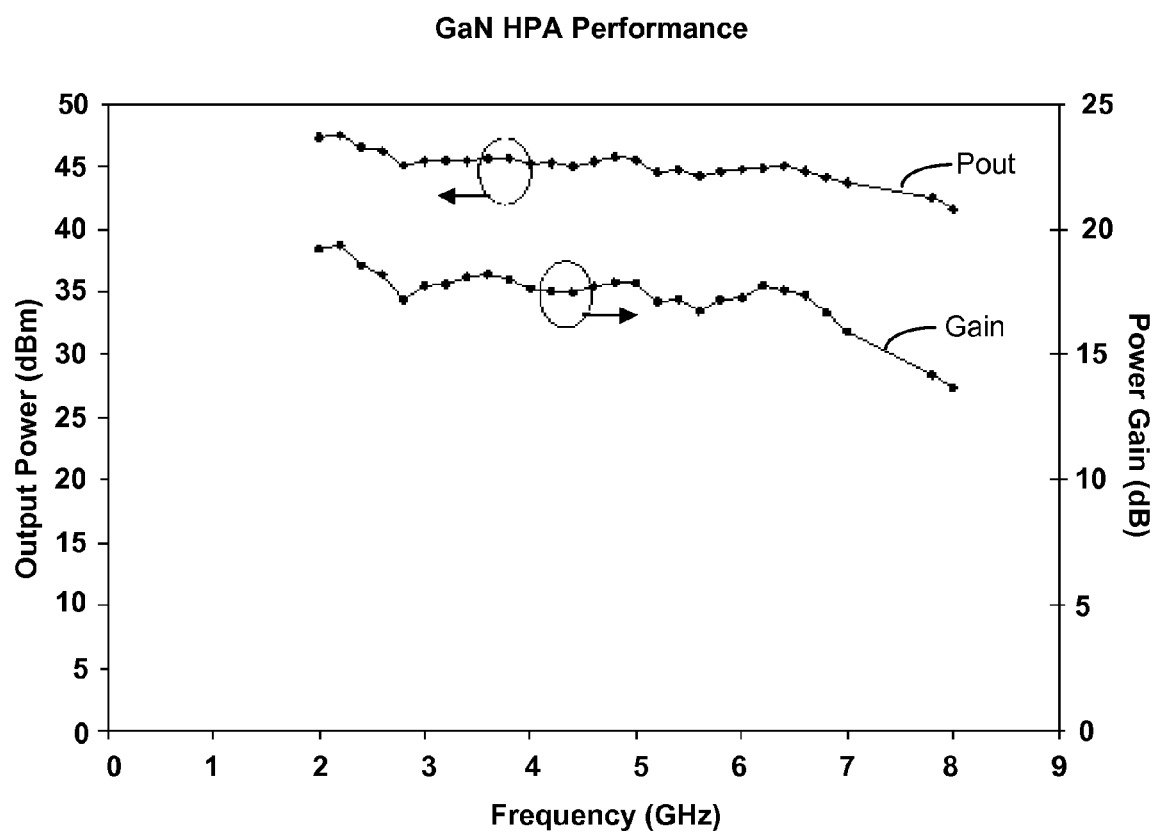
FIG. 6 is a plot of the non-shared drain HPA 500 performance showing both frequency (GHz) versus power gain (dB) and frequency (GHz) versus the input/output power ratio (dBm), in accordance with an embodiment of the present invention.

Referring to FIG. 6, the on-wafer RF measurements of the non-shared drain HPA 500 is shown when driven 2 dB into compression at a drain voltage of 36 V and a gate voltage of −1.8 V. An off-chip impedance matching circuit, fabricated on a dielectric substrate was used at the output of all the HPA MMICs to impedance-match the MMIC amplifier to 50 ohms. The non-shared drain HPA 500 of this example configuration achieved a nominal 40 watts of output power from 1 to 8 GHz when driven with 28 dBm input power (as will be appreciated, other test parameters such as input power, etc can be used, and the example provided here are not intended to imply limitations on the claimed invention).

The nearly 34 mm$^2$ size of the GaN, MMIC HPA 206 and 500 was relatively large; however, the dc-yield of these designs was exceptionally good. Using two test wafers that completed backside processing and having two different buffer materials, the dc-functional yield was examined for the two wafers. The yield criteria were a simple pinch-off screen and a relatively benign on-state modulation current screen. Table 1 illustrates the results of this analysis. The first wafer was an iron doped buffer wafer and exhibited a dc-yield of 47% (24 out of 51). Another wafer was an aluminum gallium nitride AlGaN doped buffer wafer and exhibited a dc-yield of 76% (39 out of 51). Large MMICs that pass this dc-screen have shown excellent correlation with RF functioning die when full on-wafer RF evaluation is not practical.

TABLE I

DC-Yield of Large-Periphery GaN HPA MMICs from two 3-inch wafers
DC Yields

|  |  | 07029w2 | 07029w3 | Sites/Wafer | Periphery |
|---|---|---|---|---|---|
| Full output chips | D295-4 | 4 | 9 | 12 | 4.8/14.4-mm |
|  | D295-5 | 5 | 9 | 13 | 4.8/9.6-mm |
|  | D295-7 | 9 | 9 | 13 | 4.8/12.0-mm |
|  | Total | 18 | 27 | 38 |  |
| Half output chip | D295-6 | 6 | 12 | 13 | 1.6/5.6-mm |

Figure 7:
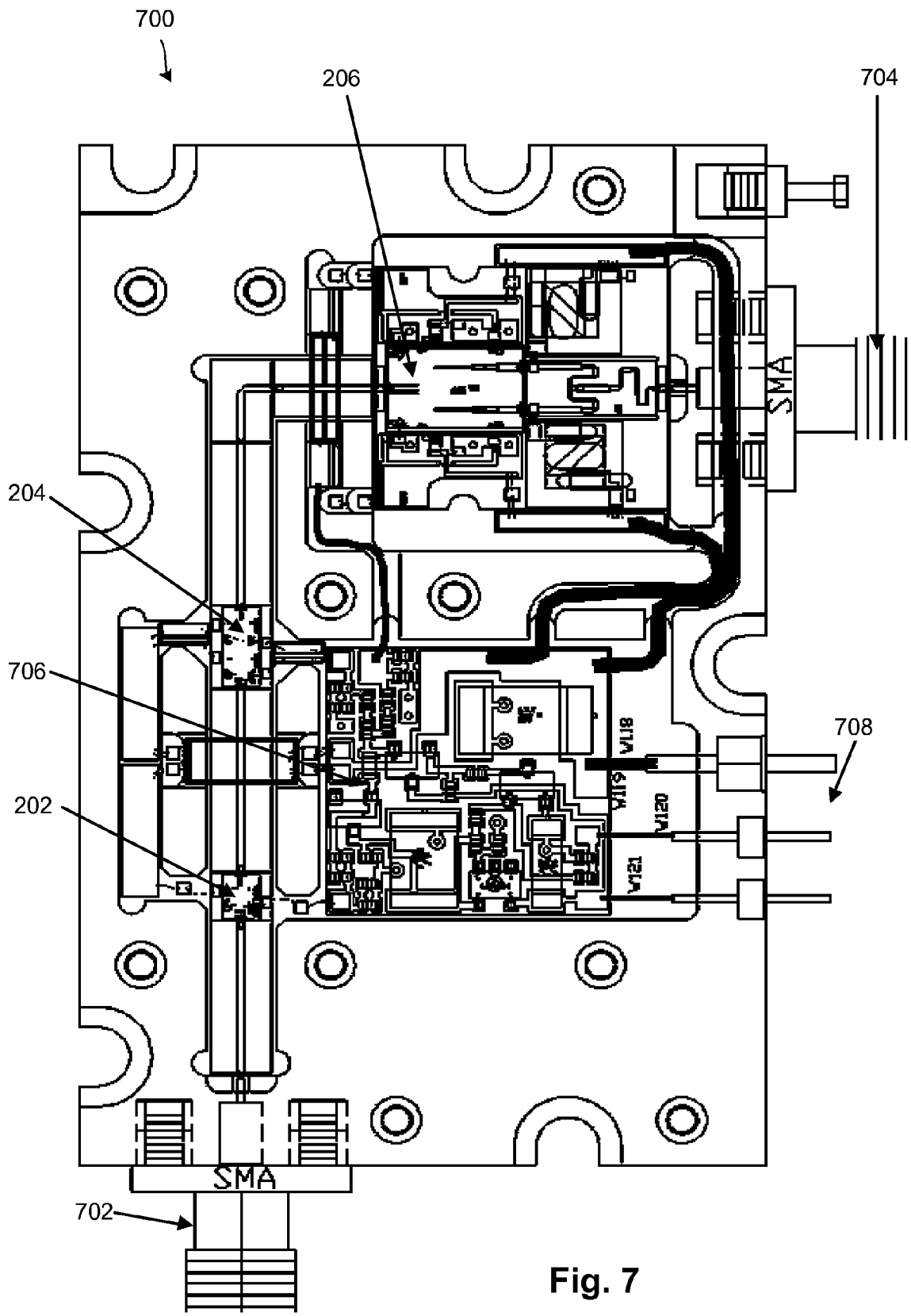
FIG. 7 is a diagram of a GaN HPA module 700 configured in accordance with an embodiment of the present invention.

Referring to FIG. 7, an HPA module 700 provided a GaN amplifier packaging that resulted in a module having an RF input 702 and RF output 704 with a total volume of 1.2 cubic-inches, in accordance with one example embodiment of the present invention. Contained within this volume is a cascade of three GaN MMIC chips including a single-stage pre-driver MMIC 202, the two-stage driver MMIC 206, and the 19.2 mm total-gate-periphery HPA MMIC 206, as well as bias conditioning circuitry 706 controlled by DC and control inputs 708. The bias conditioning circuitry 706 may be capable of supporting pulsed gate or drain bias. The dc conditioning afforded by the bias conditioning circuitry 706 enabled the application of two bipolar bias voltage ports, one for the negative gate bias and one for the higher-current drain bias. Bias filtering and voltage stability was also addressed by this bias conditioning circuitry 706. In addition to the off-chip matching network at the output of the HPA, off-chip bias components were also incorporated along each side of the GaN MMICs to facilitate MMIC biasing.

The HPA modules 700 may provide a small form-factor amplifier package. Note that the thermal management strategy employed can also consider the vicinity of the HPA 206 sub-assembly to minimize performance degradation due to die temperature. This may include, for example, the use of high thermal conductivity materials beneath the GaN HPA MMIC 206, as previously described. In this example embodiment, a total of five stages of amplifier gain are utilized in what is essentially a single transmit channel amplifier module. The resulting example amplifier provided a nominal 45 dB of power gain. The final stage was operated at 3 to 4 dB of gain compression where the output power ranged from 25 to 50 watts over the 1 to 8 GHz frequency bandwidth.

Figure 8A:
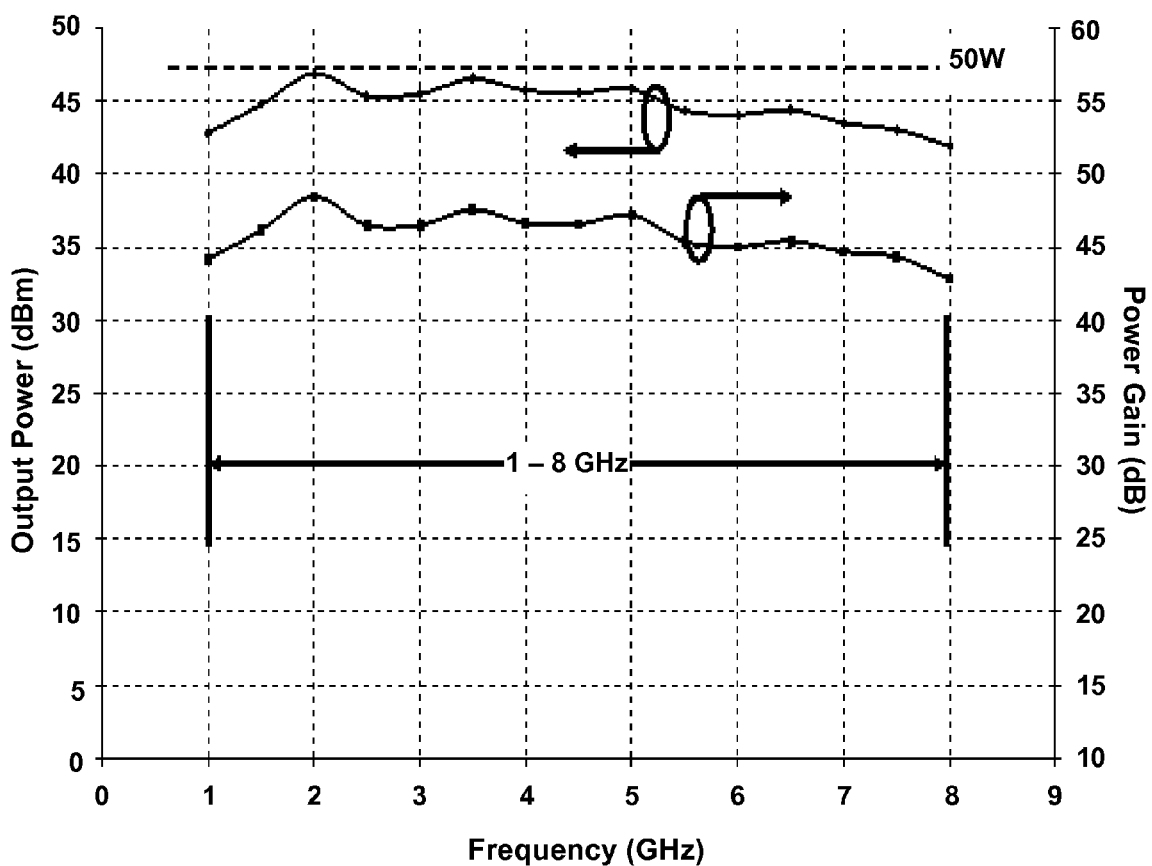
FIG. 8A shows the output power of GaN amplifier module 700 at Vd=35 V and Vg=−1.9V for a 10% duty cycle; 10 μsec pulse width, in accordance with an embodiment of the present invention.
Figure 8B:
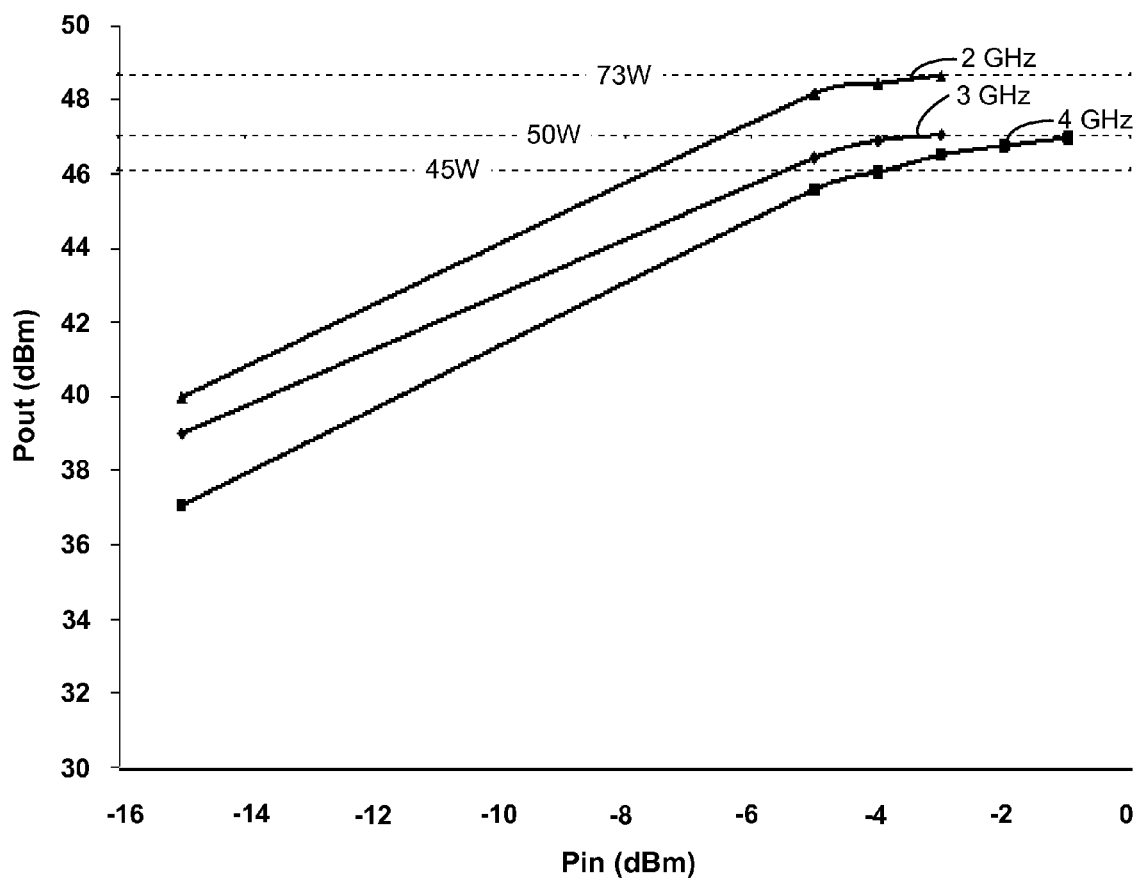
FIG. 8B shows the output power of GaN amplifier module 700 at Vd=35 V and Vg=−1.9V for 2 μsec pulse width and 1 msec period at 2, 3, and 4 GHz, in accordance with an embodiment of the present invention.

Referring to FIG. 8A, the measured output power versus frequency performance of the HPA module 700 for a 10% duty cycle operation is provided. Referring to FIG. 8B, the output power versus input power for three frequencies using a shorter pulse width of 2 µsec is also provided. The peak output power was measured at 50 W at a bias setting of Vd=35 V and $V_g$=−1.9 V under pulsed operation using a 10% pulsed duty cycle and a 10 µsec pulse width. The average output power was 40 W over the 1 to 8 GHz bandwidth. When evaluated using a more thermally benign operational mode of a 2 µsec pulse width and 2 msec period, an output power of greater than 70 W was measured. This result is consistent with a nearly 5 W/mm power density from the 14.4 mm total-gate-periphery output stage of the HPA MMIC. While present embodiments have described amplification over 1 to 8 GHz frequency band, it will be apparent in light of the disclosure that embodiment may be used to provide amplification at higher frequency bands up to about 20 GHz.

A wideband GaN on SiC amplifier MMIC chip set (pre-driver 202, driver 204, and the HPA 206) has been described for use in compact HPA modules 700 using small form-factor packages. Using a combination of elements including dual field plate GaN semiconductor technology on silicon carbide substrate, a non-uniform distributed form of MMIC amplifier architecture, and advanced thermal management in the package design, a peak output power of 70 W with an average output power of 40 W was demonstrated by this 1.2 in$^3$ HPA amplifier module 700. Operating over a 3 octave frequency bandwidth (1 to 8 GHz) with greater than 45 dB of power gain, the amplifier module 700 has demonstrated the feasibility of replacing tube-based transmitter technology with compact high-power solid-state technology having reduced size and weight as compared with tube-based amplifiers.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:
1. A high power amplifier module, comprising:
   a first plurality of distributed amplification stages operatively coupled in a first string, wherein a conductive trace of the first string has an inductance that successively decreases from input to output of the first string; and a second plurality of distributed amplification stages operatively coupled in a second string, wherein a conductive trace of the second string has an inductance that successively decreases from input to output of the second string;

wherein the high power amplifier module is configured to generate an output signal having greater power than an input signal.

2. The high power amplifier module of claim 1, wherein each of the first and second strings comprises gallium nitride transistor amplification stages interconnected by inductors, and wherein the values of the inductors are set such that the voltage and current associated with one of the gallium nitride transistor stages is equal to that associated with the other gallium nitride transistor stages to facilitate maximum power transfer and matching between interconnected stages.

3. The high power amplifier module of claim 2, wherein the inductors have values that are set such that the impedance associated with one of the gallium nitride transistor gain stage is not equal to the impedance associated with an adjacent gallium nitride transistor gain stage.

4. The high power amplifier module of claim 2, wherein the inductors have values that are set such that the impedance associated with two of the gallium nitride transistor stages is not equal to the impedance associated with an adjacent two gallium nitride transistor stages.

5. The high power amplifier module of claim 1, wherein each of the first and second strings comprises gallium nitride transistor amplification stages formed on a silicon carbide substrate.

6. The high power amplifier module of claim 1, further comprising a heat spreader material that thermally and electrically couples to the amplification stages.

7. The high power amplifier module of claim 6, wherein the heat spreader material is diamond with a metallic coating.

8. The high power amplifier module of claim 7, wherein the metallic coating is gold.

9. The high power amplifier module of claim 6, wherein the heat spreader material is chemical vapor deposited diamond with a metallic coating.

10. The high power amplifier module of claim 9, wherein the metallic coating encapsulates the chemical vapor deposited diamond.

11. The high power amplifier module of claim 1, wherein the conductive trace associated with the first string is shared with a third string comprising a third plurality of distributed amplification stages.

12. The high power amplifier module of claim 1, wherein the high power amplifier module has a solid-state package design to accommodate greater than 8 $W/mm^2$ of power dissipation.

13. The high power amplifier module of claim 1, wherein the high power amplifier module has a nominal power gain of greater than 45 dB, a nominal output power of greater than about 50 W, and a frequency bandwidth performance from 1-8 GHz.

14. The high power amplifier module of claim 13, wherein the high power amplifier module has a package dimension equal or less than 1.2 cubic inches.

15. The high power amplifier module of claim 1, further comprising a pre-driver or a driver.

16. A method for forming a power amplifier, comprising:
operatively coupling a first plurality of distributed amplification stages in a first string;
providing, as part of the first string, a conductive trace that has an inductance that successively decreases from input to output of the first string;
operatively coupling a second plurality of distributed amplification stages in a second string;
providing, as part of the second string, a conductive trace that has an inductance that successively decreases from input to output of the second string; and
providing a heat spreader material that thermally and electrically couples to the amplification stages.

17. A high power amplifier, formed by the method of claim 16, wherein each of the first and second strings comprises gallium nitride transistor amplification stages.

18. The high power amplifier of claim 17, wherein at least one of the gallium nitride transistor amplification stages comprises a dual field plate transistor with a silicon carbide substrate.

19. The high power amplifier of claim 17, wherein values of the associated inductance are set such that the voltage and current associated with one of the gallium nitride transistor amplification stages is equal to that associated with the other gallium nitride transistor amplification stages to facilitate maximum power transfer and matching between interconnected stages.

20. The high power amplifier of claim 17, wherein the heat spreader material is chemical vapor deposited diamond with a metallic coating.

21. The method of claim 16, wherein the conductive trace associated with the first string is shared with a third string comprising a third plurality of distributed amplification stages.

* * * * *